United States Patent
Hirasawa et al.

(10) Patent No.: US 9,253,862 B2
(45) Date of Patent: Feb. 2, 2016

(54) PLASMA PROCESSING METHOD AND PLASMA PROCESSING APPARATUS

(71) Applicant: TOKYO ELECTRON LIMITED, Tokyo (JP)

(72) Inventors: Tatsuo Hirasawa, Nirasaki (JP); Osamu Yokoyama, Nirasaki (JP); Chiaki Yasumuro, Nirasaki (JP); Toshiaki Fujisato, Nirasaki (JP); Ryota Yoshida, Nirasaki (JP); Takashi Sakuma, Nirasaki (JP); Cheonsoo Han, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/044,659

(22) Filed: Oct. 2, 2013

(65) Prior Publication Data

US 2014/0090597 A1    Apr. 3, 2014

(30) Foreign Application Priority Data

Oct. 3, 2012 (JP) ................................ 2012-220887

(51) Int. Cl.
*H05H 1/24* (2006.01)
*H05F 3/00* (2006.01)
*C23C 16/50* (2006.01)
*C23C 14/34* (2006.01)
(Continued)

(52) U.S. Cl.
CPC *H05F 3/00* (2013.01); *C23C 14/34* (2013.01); *C23C 14/50* (2013.01); *C23C 16/50* (2013.01); *H01J 37/32568* (2013.01); *H01J 37/34* (2013.01); *H01L 21/6833* (2013.01)

(58) Field of Classification Search
CPC ........... H05F 3/00; C23C 16/50; C23C 14/34; C23C 14/50
USPC .......................................................... 427/569
See application file for complete search history.

(56) References Cited

U.S. PATENT DOCUMENTS

| 5,573,981 | A | | 11/1996 | Sato |
| 5,684,669 | A | * | 11/1997 | Collins et al. ................. 361/234 |

(Continued)

FOREIGN PATENT DOCUMENTS

| JP | 07-094500 | 4/1995 |
| JP | 09-502078 | 2/1997 |

(Continued)

OTHER PUBLICATIONS

Patent Abstracts of Japan, Publication No. 2006-135081; Publication Date: May 25, 2006, Japan Patent Office.

(Continued)

*Primary Examiner* — Kelly M Gambetta

(57) ABSTRACT

In a plasma processing method, plasma processing is performed in a state where the object is attracted and held on the electrostatic chuck by applying a first voltage as an application voltage thereto and a thermal conduction gas is supplied to a gap between the electrostatic chuck and the object. The application voltage is decreased while stopping the supply of the thermal conduction gas and exhausting the thermal conduction gas remaining between the electrostatic chuck and the object upon completion of the plasma processing. The object is separated from the electrostatic chuck by setting the application voltage to the electrostatic chuck to zero after the application voltage is decreased.

10 Claims, 7 Drawing Sheets

(51) Int. Cl.
*C23C 14/50* (2006.01)
*H01J 37/34* (2006.01)
*H01L 21/683* (2006.01)
*H01J 37/32* (2006.01)

(56) References Cited

U.S. PATENT DOCUMENTS

| | | | |
|---|---|---|---|
| 5,997,962 A * | 12/1999 | Ogasawara et al. | 427/535 |
| 2009/0087583 A1 * | 4/2009 | Sakuma et al. | 427/569 |
| 2009/0183984 A1 * | 7/2009 | Sakuma et al. | 204/192.15 |
| 2010/0254063 A1 * | 10/2010 | Sheng et al. | 361/234 |

FOREIGN PATENT DOCUMENTS

| | | |
|---|---|---|
| JP | 2006-135081 | 5/2006 |
| JP | 2012-074522 | 4/2012 |
| WO | 95/24764 | 9/1995 |

OTHER PUBLICATIONS

Patent Abstracts of Japan, Publication No. 2012-074522; Publication Date: Apr. 12, 2012, Japan Patent Office.

Patent Abstracts of Japan, Publication No. 07-094500; Publication Date: Apr. 7, 1995, Japan Patent Office.

* cited by examiner

< PLASMA PROCESSING METHOD OF PRESENT INVENTION >

< PLASMA PROCESSING METHOD OF CONVENTIONAL METHOD >

<CHUCKING>

<OPENING/CLOSING SWITCH CLOSED
→ ELECTRODE 32A IS GROUNDED>

PLASMA PROCESSING METHOD AND PLASMA PROCESSING APPARATUS

CROSS-REFERENCE TO RELATED APPLICATIONS

This application claims priority to Japanese Patent Application No. 2012-220887 filed on Oct. 3, 2012, the entire contents of which are incorporated herein by reference.

FIELD OF THE INVENTION

The present invention relates to a plasma processing method and a plasma processing apparatus for performing plasma processing, such as film formation or the like, on an object such as a semiconductor wafer or the like.

BACKGROUND OF THE INVENTION

Generally, in manufacturing semiconductor devices, a desired device is manufactured by repeatedly performing various processes such as film formation, etching and the like on a semiconductor wafer. Along with the trend toward high integration and high miniaturization of the semiconductor devices, miniaturization of a line width or a hole diameter is required more and more. Further, as for a wiring material or a buried material, inexpensive Cu having a considerably low electrical resistance tends to be used to reduce the electrical resistance and deal with miniaturization of various sizes of wiring structures (Japanese Patent Application Publication No. H07-094500). Moreover, as for the wiring material or the buried material, Ta, Ti or the like tends to be used in addition to Cu.

In order to form a thin film containing the above metal, a plasma processing apparatus such as a plasma CVD apparatus, a plasma sputtering apparatus, a plasma etching apparatus or the like is generally used (see Japanese Patent Application Publication Nos. H07-094500, H09-502078, 2006-135081, and 2012-074522). In this plasma processing apparatus, an electrostatic chuck on which a semiconductor wafer is attracted and held by an electrostatic force (Coulomb force) is provided on a mounting table in a processing chamber. A plasma is generated by a high frequency power or the like in the processing chamber, and a thin film is formed on the wafer at a relatively low temperature of, e.g., about 200° C. to 400° C., by emitting metal ions from the metal target or by activating a film forming gas by the plasma thus generated. Depending on processing types, the temperature may exceed the above temperature range.

In the plasma processing, a thermal conduction gas whose pressure has been increased compared to a processing pressure is supplied between the electrostatic chuck and the wafer to improve thermal conduction between the wafer and the mounting table for control of a wafer temperature. Upon completion of the plasma processing, a floating force applied to the wafer is suppressed by stopping the supply of the thermal conduction gas and, then, a chuck voltage as an application voltage to the electrostatic chuck is off. Next, the wafer is separated from the mounting table by using lifter pins or the like.

In that case, charges remain on the wafer due to the effect of electrostatic attraction, so that the remaining charges need to be removed to prevent adhesion of particles or bounce of the wafer during the separation of the wafer. Therefore, conventionally, an opposite voltage is applied to an electrostatic chuck (Japanese Patent Application Publication No. H07-094500). In addition, an optimal voltage for minimizing an electrostatic attraction force is applied, or a charge neutralization gas is supplied (Japanese Patent Application Publication No. 2006-135081).

Meanwhile, it is general to increase a chuck voltage in order to sufficiently increase an attraction force during the plasma processing. However, when a sufficient attraction force is obtained, residual charges cannot be sufficiently removed even by the aforementioned various charge neutralization processes. This causes generation of particles when the wafer is separated from the mounting table.

Particularly, the amount of remaining charges is increased in proportion to the chuck voltage, so that the relationship between the attraction force and the amount of generated particles is a trade-off relationship. Therefore, it is currently required to develop a new method for suppressing the particle generation amount while realizing a sufficient attraction force.

SUMMARY OF THE INVENTION

In view of the above, the present invention provides a plasma processing method and a plasma processing apparatus capable of obtaining a chucking force (attraction force) during plasma processing and reducing the particle generation amount by reducing the residual charge amount during the plasma processing.

In accordance with an aspect of the present invention, there is provided a plasma processing method for performing plasma processing on an object attracted and held on an electrostatic chuck provided on a top surface of a mounting table, including: a plasma processing step of performing plasma processing in a state where the object is attracted and held on the electrostatic chuck by applying a first voltage as an application voltage thereto and a thermal conduction gas is supplied to a gap between the electrostatic chuck and the object; an application voltage decreasing step of decreasing the application voltage while stopping the supply of the thermal conduction gas and exhausting the thermal conduction gas remaining between the electrostatic chuck and the object upon completion of the plasma processing step; and a separation step of separating the object from the electrostatic chuck by setting the application voltage to the electrostatic chuck to zero after the application voltage decreasing step.

In accordance with another aspect of the present invention, there is provided a plasma processing apparatus for performing plasma processing on an object, including: a processing chamber configured to accommodate the object; a mounting table structure including a mounting table having on a top surface thereof an electrostatic chuck for attracting and holding the object; a voltage supply system configured to apply a voltage to the electrostatic chuck; a plasma generator configured to generate a plasma in the processing chamber; a gas introducing unit configured to introduce a gas required for the plasma processing into the processing chamber; a gas exhaust unit configured to exhaust atmosphere in the processing chamber; a thermal conduction gas supply system configured to supply a thermal conduction gas to a gap between the electrostatic chuck and the object; lifter pins configured to vertically move the object with respect to the mounting table; and an apparatus control unit configured to control the apparatus to perform the plasma processing described in any one of claims 1 to 10.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
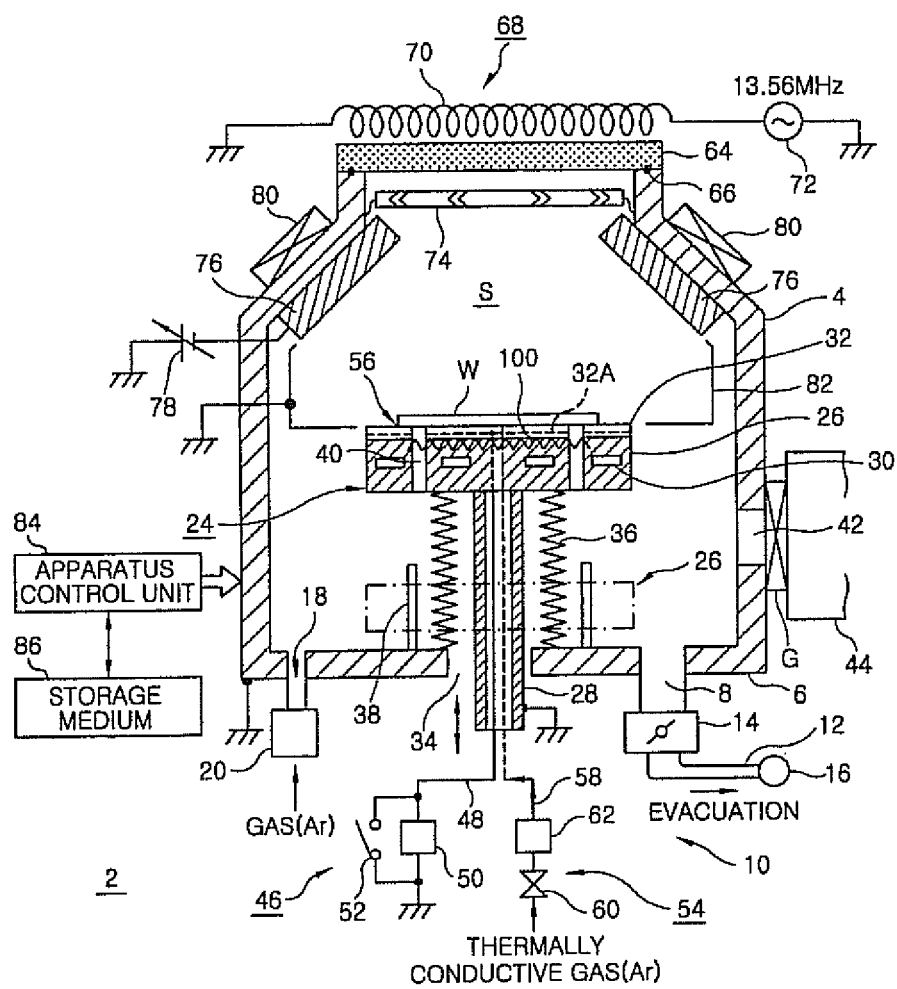
FIG. 1 is a cross sectional view showing an example of a plasma processing apparatus of the present invention.

Hereinafter, embodiments of a plasma processing method and a plasma processing apparatus of the present invention will be described in detail with reference to the accompanying. FIG. 1 is a cross sectional view showing an example of the plasma processing apparatus of the present invention. Here, an ICP (Inductively Coupled Plasma) type plasma sputtering apparatus will be described as an example of the plasma processing apparatus.

As shown in FIG. 1, a plasma processing apparatus 2 includes a cylindrical processing chamber 4 made of, e.g., aluminum or the like. The processing chamber 4 is grounded, and a gas exhaust port 8 is provided at a bottom portion 6 thereof. A gas exhaust unit 10 for exhausting an atmosphere in the processing chamber 4 is connected to the gas exhaust port 8. The gas exhaust unit 10 has a gas exhaust passage 12 connected to the gas exhaust port 8. A throttle valve 14 and a vacuum pump 16 which control a pressure are sequentially installed in the gas exhaust passage 12, so that vacuum evacuation can be carried out.

Further, a gas introducing unit, e.g., a gas inlet port 18, for introducing a specific gas required for plasma processing into the processing chamber 4 is provided at the bottom portion 6 of the processing chamber 4. A rare gas as a plasma excitation gas, e.g., Ar gas or the like, or another required gas, e.g., $N_2$ gas or the like, is supplied from the gas inlet port 18 through a gas control unit 20 including a gas flow rate controller, a valve or the like.

Provided in the processing chamber 4 is a mounting table structure 24 for mounting thereon a semiconductor wafer W as an object to be processed. The mounting table structure 24 includes a circular plate-shaped mounting table 26, and a hollow cylindrical support 28 for supporting the mounting table 26. The support 28 is grounded, so that the mounting table 26 is also grounded. The mounting table 26 is made of a conductive material, e.g., an aluminum alloy or the like, and has therein a cooling jacket 30 serving as a cooling unit. By supplying a coolant through a coolant path (not shown), the wafer temperature can be controlled.

Further, a thin circular plate-shaped electrostatic chuck 32 made of a ceramic material, e.g., aluminum nitride, and having an electrode 32A therein is provided on a top surface of the mounting table 26, and a semiconductor wafer W can be attracted and held thereon by an electrostatic force (Coulomb force). Moreover, the lower portion of the support 28 extends downward through a through hole 34 formed at the center of the bottom portion 6 of the processing chamber 4. The support 28 can be vertically moved by an elevation unit (not shown), so that the entire mounting table structure 24 can be vertically moved.

An extensible/contractible metallic bellows 36 is provided to surround the support 28. The bellows 36 has an upper end airtightly coupled to the bottom surface of the mounting table 26 and a lower end airtightly coupled to the top surface of the bottom portion 6. Thus, the mounting table structure 24 can be moved up and down while maintaining airtightness in the processing chamber 4.

A plurality of, e.g., three (only two being shown in the illustrated example) lifter pins 38 stand upright on the bottom portion 6. Further, pin holes 40 are formed in the mounting table 26 so as to correspond to the lifter pins 38. Accordingly, when the mounting table 26 is lowered, the wafer W is received by the upper ends of the lifter pins 38 passing through the pin holes 40 and transferred to and from a transfer arm (not shown) entered from the outside.

In other words, the wafer W can be moved up and down with respect to the mounting table 26. A loading/unloading port 42 through which the transfer arm enters is provided at a lower sidewall of the processing chamber 4, and an openable/closeable gate valve G is provided at the loading/unloading port 42. Provided at the opposite side of the gate valve G to the processing chamber 4 is, e.g., a vacuum transfer chamber 44.

Connected to the electrode 32A of the electrostatic chuck 32 disposed on the mounting table 26 is a voltage supply system 46 for applying a voltage to the electrode 32A. The voltage supply system 46 has a power supply line 48 connected to the electrode 32A. Moreover, a chuck power supply 50 is connected through the power supply line 48 to the electrode 32A, and the semiconductor wafer W is attracted and held by an electrostatic force. The chuck power supply 50 can selectively output a plus voltage or a minus voltage, if necessary.

Further, a grounding switch 52 is connected in parallel to the chuck power supply 50, and the electrode 32A can be grounded if necessary. Moreover, a high frequency bias power supply (not shown) is connected to the power supply line 48, and a high frequency bias power is supplied to the electrode 32A of the electrostatic chuck 32 through the power supply line 48. The frequency of the high frequency power is, e.g., about 13.56 MHz. In addition, the mounting table 26 is provided with a thermal conduction gas supply system 54 for introducing a thermal conduction gas to a gap 56 between the electrostatic chuck 32 and the wafer W.

The thermal conduction gas supply system 54 has a gas passage 58 communicating with the gap 56 while being inserted into the support 28. An opening/closing valve 60 and a flow rate controller 62 such as a mass flow controller are sequentially installed in the gas passage 58, and, a thermal conduction gas, e.g., Ar gas, is supplied to the gap 56. The thermal conduction gas is not limited to Ar gas, and may be $N_2$ gas or another rare gas such as He or the like.

Meanwhile, a high frequency transmission plate 64 made of a dielectric material, e.g., aluminum nitride or the like, is airtightly provided at a ceiling portion of the processing chamber 4 with a seal member 66 such as an O-ring or the like therebetween. Provided above the transmission plate 64 is a plasma generator 68 for generating a plasma in a processing space S of the processing chamber 4 by converting a rare gas as a plasma excitation gas, e.g., Ar gas, into a plasma.

As for the plasma excitation gas, another rare gas, e.g., He, Ne or the like may be used instead of Ar gas. Specifically, the plasma generator 68 includes an induction coil 70 that is disposed so as to correspond to the transmission plate 64. A high frequency power supply 72, of, e.g., 13.56 MHZ, for plasma generation is connected to the induction coil 70, so that a high frequency power can be introduced into the processing space S through the transmission plate 64. The plasma generator 68 may use a microwave power instead of a high frequency power.

A baffle plate 74 made of, e.g., aluminum, for diffusing the introduced high frequency is provided immediately below the transmission plate 64. Further, a metallic target 76 of a ring shape having an inwardly upwardly inclined cross section (truncated conical shape) is provided below the baffle plate 74 so as to surround an upper portion of the processing space S. Connected to the metallic target 76 is a variable DC power supply 78 for target for supplying a voltage for attracting Ar ions. Moreover, an AC power supply may be used instead of the DC power supply.

A magnet 80 is provided at an outer peripheral side of the metallic target 76 to apply a magnetic field thereto. In the present embodiment, as for the material of the metallic target 76, Cu (copper) is used, for example. The Cu target 76 is sputtered by Ar ions in the plasma as Cu atoms or Cu atomic groups which are mostly ionized while passing through the plasma. The material of the target 76 is not limited to Cu.

Moreover, a cylindrical protective cover member 82 made of e.g. aluminum or copper, is provided below the metallic target 76 so as to surround the processing space S. The protective cover member 82 is grounded, and a lower portion thereof is bent inward so as to be positioned near the side portion of the mounting table 26.

The respective components of the plasma processing apparatus 2 are connected to and controlled by an apparatus control unit 84 including, e.g., a computer or the like. Specifically, the apparatus control unit 84 controls the operations of the high frequency power supply 72 for plasma generation, the variable DC power supply 78, the gas control unit 20, the throttle valve 14, the vacuum pump 16, the voltage supply system 46, the thermal conduction gas supply system 54 and the like. Further, the apparatus control unit 84 has a storage medium 86 storing a program that is executable by the computer for performing control. The storage medium 86 may be, e.g., a flexible disk, a CD (Compact Disc), a hard disk, a flash memory, a DVD or the like.

<Description on the Plasma Processing Method>

Figure 2:
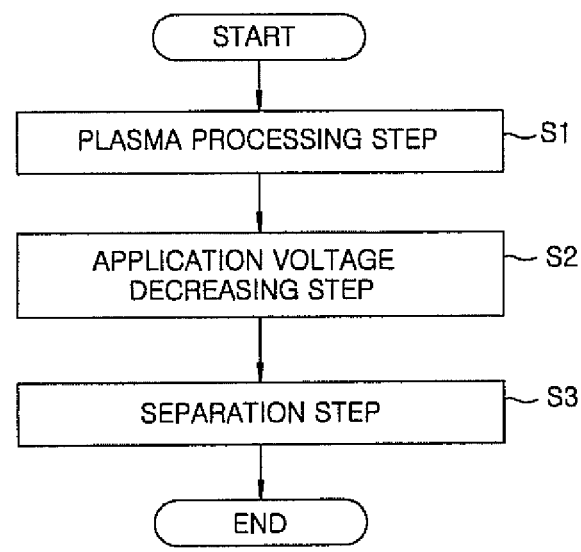
FIG. 2 is a flowchart for explaining an example of a plasma processing method of the present invention.
Figure 3A:
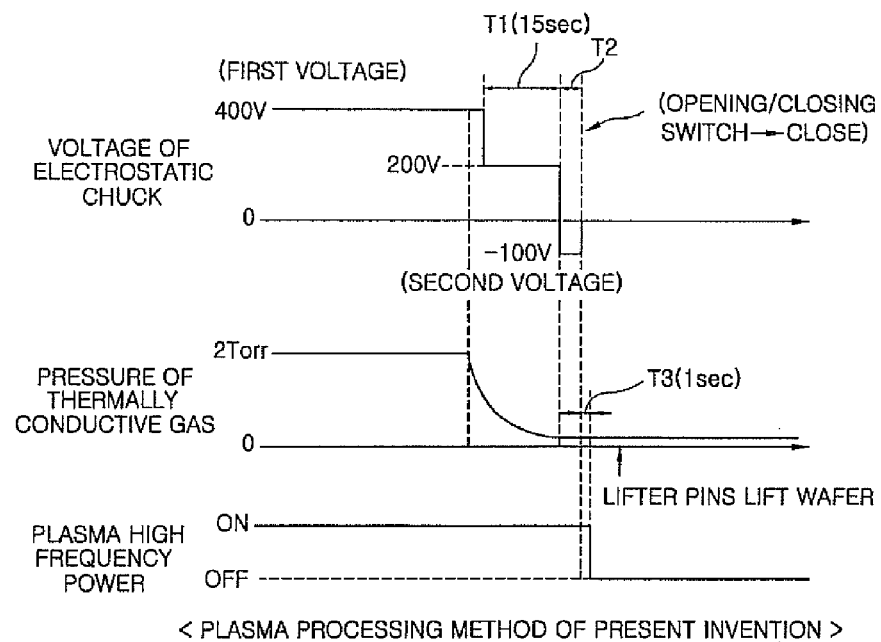
FIGS. 3A and 3B show timing charts for comparing the method of the present invention and a conventional method.
Figure 3B:
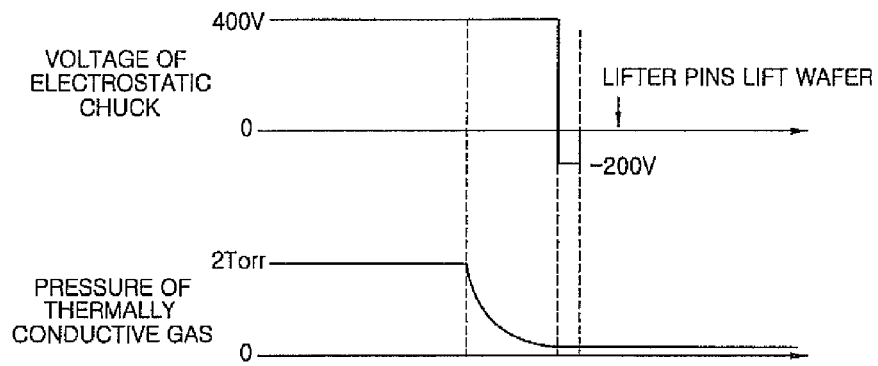
Figure 4A:
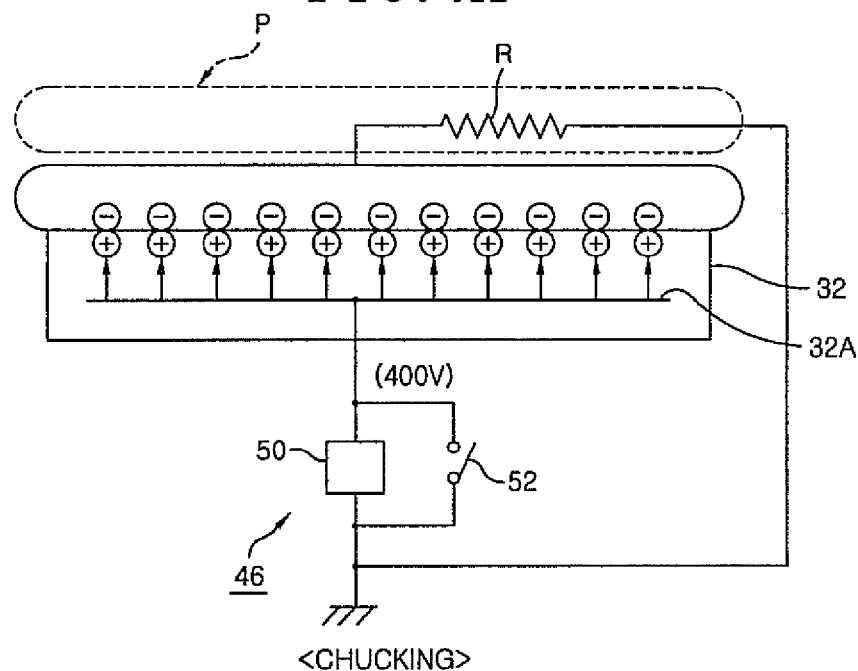
FIGS. 4A and 4B show states of residual charges in the method of the present invention.
Figure 4B:
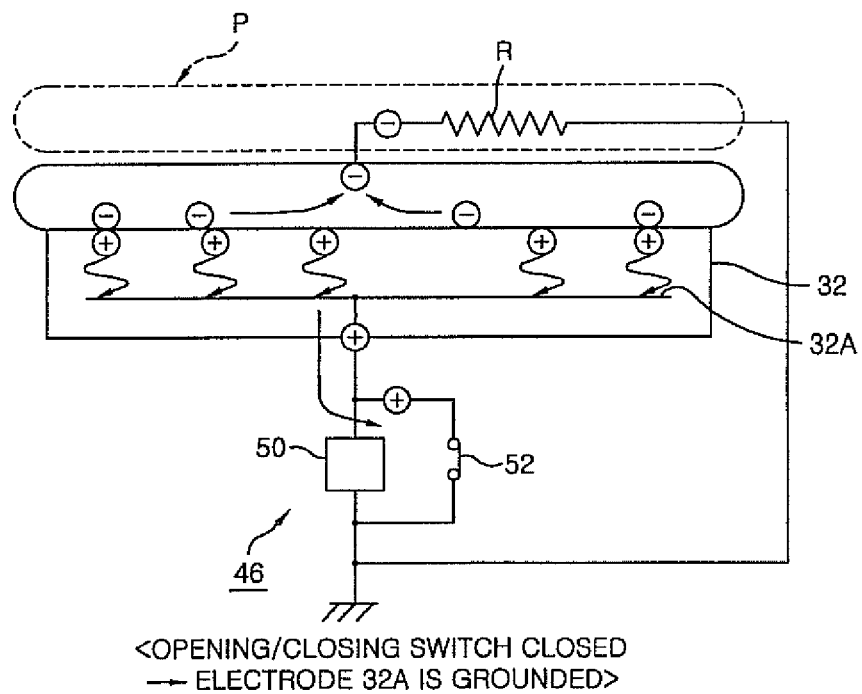

Hereinafter, the operation of the plasma processing apparatus configured as described above will be described with reference to FIGS. 2 to 4. FIG. 2 is a flowchart for explaining an example of a plasma processing method of the present invention. FIGS. 3A and 3B show timing charts for comparing the method of the present invention and a conventional method. FIGS. 4A and 4B show states of residual charges in the method of the present invention;

First, the method of the present invention includes: a plasma processing step S1 of performing plasma processing in a state where the wafer W is attracted and held on the electrostatic chuck 32 by applying a first voltage as an the electrostatic chuck 32 and a thermal conduction gas is supplied to the gap between the electrostatic chuck 32 and the wafer W; an application voltage decreasing step S2 of decreasing the application voltage while exhausting the thermal conduction gas remaining between the electrostatic chuck 32 and the wafer W by stopping the supply of the thermal conduction gas upon completion of the plasma processing step; and a separation step S3 of separating the wafer W from the electrostatic chuck 32 by setting a voltage applied to the electrostatic chuck 32 to zero after the application voltage decreasing step.

Specifically, first, in the plasma processing step S1, the wafer W is loaded into the processing chamber 4 of the plasma processing apparatus 2 which has been set to a vacuum state. The wafer W is mounted on the mounting table 26 and attracted and held on the electrostatic chuck 32. Then, a thermal conduction gas, e.g., Ar gas, is supplied to the gap 56 between the wafer W and the electrostatic chuck 32 at a controlled flow rate by the thermal conduction gas supply system 54. Next, Ar gas flows in the vacuum-exhausted processing chamber 4 by operating the gas control unit 20, and the inside of the processing chamber 4 is maintained at a predetermined vacuum level by controlling the throttle valve 14. Thereafter, a DC power is applied to the metallic target 76 from the variable DC power supply 78, and a high frequency power (plasma power) is supplied to the induction coil 70 from the high frequency power supply 72 of the plasma generator 68.

Meanwhile, the apparatus control unit 84 sends an instruction to the high frequency bias power supply (not shown), and a predetermined high frequency bias power is supplied to the electrode 32A of the electrostatic chuck 32. In the processing chamber 4 thus controlled, Ar ions are generated in Ar plasma formed by the high frequency power supplied to the induction coil 70. These ions are attracted by the voltage applied to the metallic target 76 to collide with the metallic target 76. The metallic target 76 is sputtered, so that metal particles are emitted. At this time, the amount of emitted metal particles is controlled by the DC power applied to the target 76.

Metal atoms and atomic groups that are metal particles sputtered from the metal target 76 are mostly ionized while passing through the plasma. Here, the metal particles are scattered in a state where the ionized metal ions and the electrically neutral metal atoms are mixed with each other. Further, the metal ions and the like are deposited on the semiconductor wafer W, thereby forming a metal thin film.

The processing pressure at this time ranges from about 5 mTorr to 90 mTorr (about 1 Torr=133.3 Pa), for example. The wafer W is effectively cooled by the mounting table 26 having the cooling jacket 30 through Ar gas as a thermal conduction gas supplied to the gap 56, to a temperature ranging from, e.g., about 25° C. to 500° C. Further, as shown in FIG. 3A, the first voltage as a voltage (chuck voltage) applied to the electrostatic chuck 32 ranges from about 300V to 1400V. Here, 400V (volt) is applied as the first voltage. Further, the pressure in the gap 56 to which Ar gas as a thermal conduction gas is supplied is, e.g., about 2 Torr, which is higher than a processing pressure. The pressure of the thermal conduction gas may be increased to a maximum of, e.g., about 20 Torr.

The (chucking) state of the attracted wafer W at that time is shown in FIG. 4A. By applying a plus voltage to the electrode 32A of the electrostatic chuck 32, polarization of plus and minus charges occurs between the dielectric layer of the electrostatic chuck 32 and the wafer W, and the wafer W is attracted and held. Here, the plasma equivalently functions as a resistor R.

Upon completion of the plasma processing step, the application voltage decreasing step S2 is executed, and the supply of the thermal conduction gas is stopped by closing the opening/closing valve 60 (see FIG. 1) of the thermal conduction gas supply system 54, as shown in FIG. 3A. Accordingly, Ar gas remaining in the gap 56 between the electrostatic chuck 32 and the wafer W is gradually exhausted. As a result, the pressure of the thermal conduction gas is gradually decreased from 2 Torr.

Almost at the same time, the first voltage, i.e., 400 V, which has been applied to the electrostatic chuck 32 is decreased to the second voltage. The second voltage is a voltage at which the number of particles generated during separation of the wafer W from the mounting table 26 is reduced. The second voltage is 280V or below, and preferably 200V or below. When the chuck voltage is smaller than 150V, the chucking force is insufficient. Therefore, the lower limit of the second voltage is 150V. Here, 200V is used as the second voltage, as will be described later. FIG. 3B shows an example of the conventional plasma processing method for comparison.

In FIG. 3A, the voltage is decreased from 400V to 200V as the second voltage in a single step manner. At this time, the high frequency power supply for plasma generation is in an ON state and the plasma is constantly generated in the processing space S, to thereby reduce the residual charge amount of the wafer W.

When the residual charge amount is sufficiently reduced after a predetermined period of time T1 elapses, an opposite voltage having a different polarity is applied to the electrostatic chuck 32 for a short period of time T2. Here, −100V is applied as the opposite voltage. The time T1 is within a range, e.g., from about 14 sec to 29 sec, e.g., about 15 sec. The time T2 is within a range, e.g., from about 0.5 sec to 5 sec, e.g., about 1 sec. Therefore, the residual charge amount of the wafer W is further reduced. The supply of Ar gas that has been introduced into the processing space 4 from the gas inlet port 18 as the gas introduction unit is stopped after the lifter pins are moved.

After the application voltage decreasing step S2 is completed, the process proceeds to the separation step S3. In other words, the application voltage to the electrostatic chuck 32 is set to zero, and the wafer W is lifted by the lifter pins 38 by lowering the mounting table 26 to thereby separate the wafer W from the electrostatic chuck 32. The processed wafer W is unloaded from the processing chamber 4.

Here, the application voltage to the electrostatic chuck 32 is set to zero, and the electrode 32A is grounded by closing the grounding switch 52. After a short period of time T3 elapses, the high frequency power supply 72 for plasma generation is switched off. The plasma is generated until the high frequency power supply 72 for plasma generation is switched off so that the residual charges of the wafer W can be eliminated as much as possible. The time T3 is within a range from about 1 sec to 30 sec, for example. Here, the time T3 is about 1 sec. Further, in the conventional plasma processing method shown in FIG. 3B, the process directly proceeds to the separation step without executing the application voltage decreasing step S2.

As described above, upon completion of the plasma processing step, the supply of the thermally conducive gas that has been supplied to the gap 56 between the wafer W and the electrostatic chuck 32 is stopped by closing the opening/closing valve 60, and the remaining thermal conduction gas is exhausted from the gap 56. Further, the application voltage to the electrostatic chuck 32 is reduced from the first voltage (400V) to the second voltage (200V). Accordingly, the residual charges of the wafer W are decreased together with the thermal conduction gas, and the residual charge amount of the wafer W can be suppressed. At this time, the chucking force is reduced by decreasing the application voltage to the electrostatic chuck 32 to 200V. Since, however, the pressure is abruptly decreased from 2 Torr by stopping the supply of the thermal conduction gas as described above, the bounce of the wafer W can be suppressed.

Since the residual charge amount of the wafer W can be reduced as described above, the vibration that occurs at the wafer W during the separation of the wafer W from the mounting table 26 is suppressed. As a result, the particle generation amount can be reduced.

Here, after the opposite voltage of, e.g., −100V, is applied to the electrostatic chuck 32, the state in which the electrode 32A of the electrostatic chuck 32 is grounded while the plasma is generated in the processing space S is maintained for a short period of time T3. Therefore, as shown in FIG. 4B, charges of the dielectric layer of the electrostatic chuck 32, e.g., plus charges, flow to the earth via the grounding switch 52 for the period of time T3, and the residual charges remaining on the wafer, e.g., minus charges, flow to the earth via the equivalent resistor R of the plasma P. Hence, the residual charge amount of the wafer itself can be further reduced.

As described, in accordance with the present invention, in the plasma processing method for performing plasma processing on an object attracted and held on the electrostatic chuck 32 provided on the top surface of the mounting table 26, the chucking force (attraction force) can be sufficiently obtained during the plasma processing and, also, the particle generation amount can be suppressed by reducing the residual charge amount during the plasma processing.

(Evaluation Test)

Figure 5:
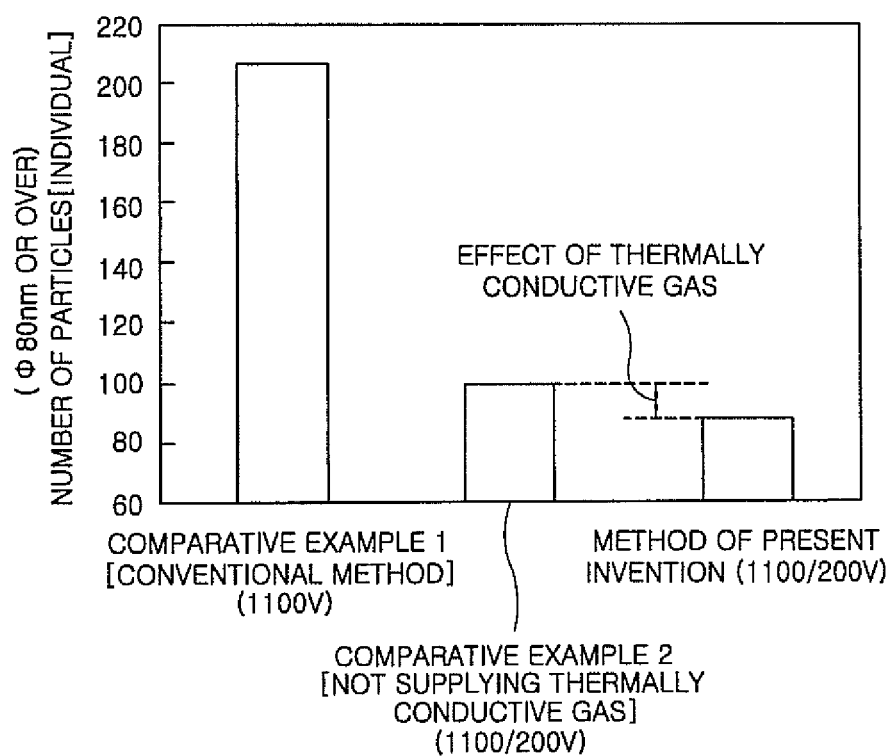
FIG. 5 is a graph showing the number of particles generated in the case of performing the method of the present invention and methods of comparative examples.
Figure 6A:
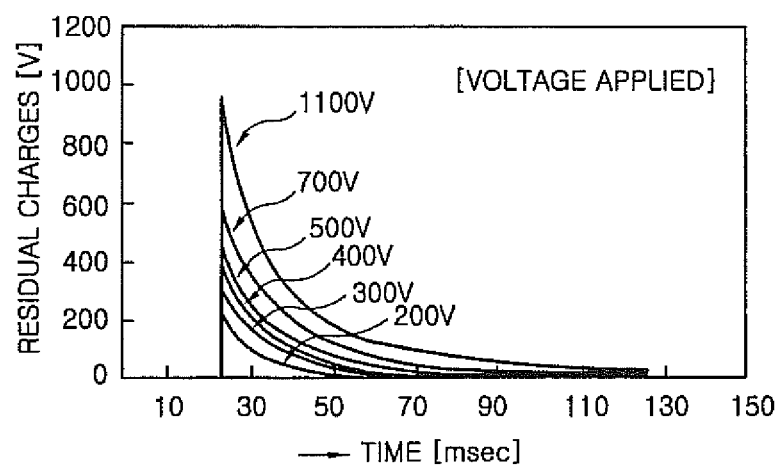
FIGS. 6A and 6B are graphs showing relationship between a voltage applied to an electrostatic chuck and residual charges of a wafer.
Figure 6B:
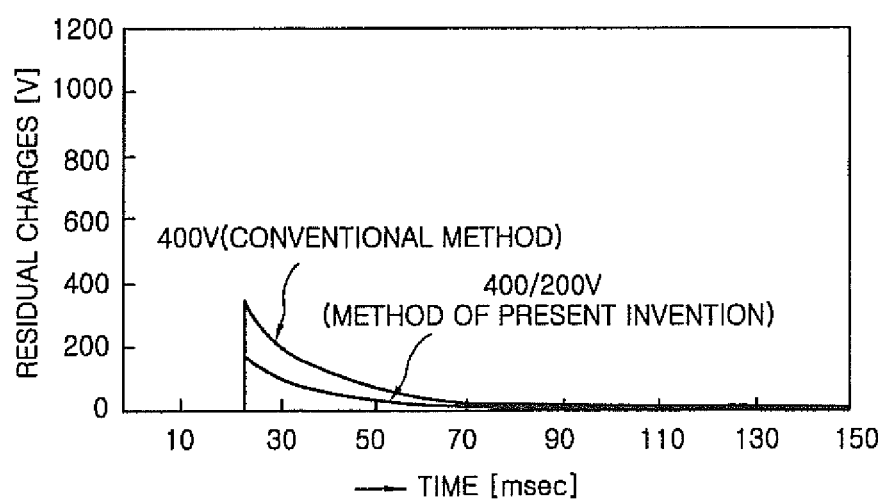
Figure 7:
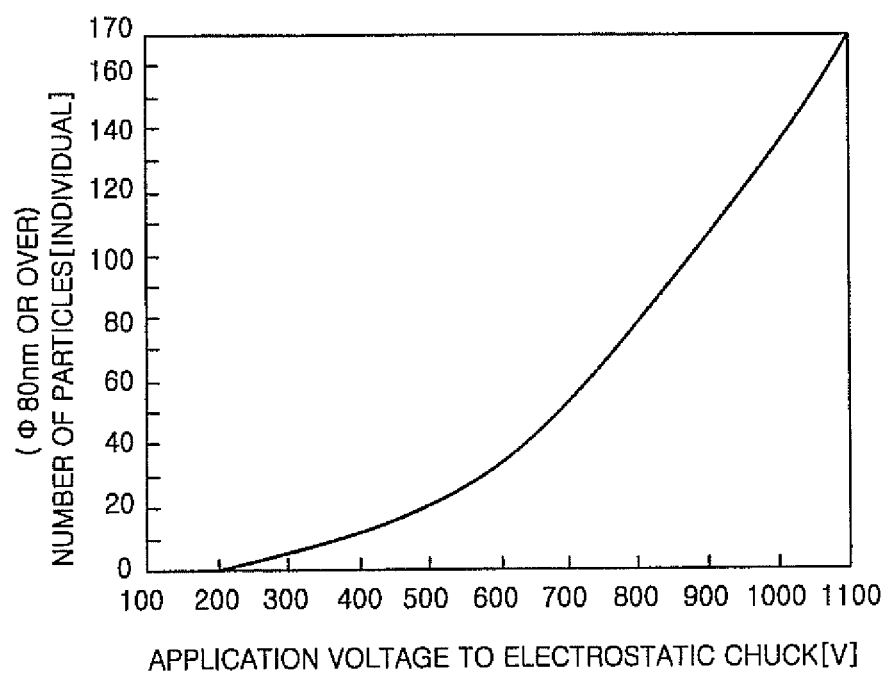
FIG. 7 is a graph showing relationship between a voltage applied to an electrostatic chuck and the number of generated particles.

Hereinafter, a result of evaluation test for the above-described method of the present invention will be described with reference to FIGS. 5 to 7. FIG. 5 is a graph showing the number of particles generated in the case of performing the method of the present invention and methods of comparative examples. FIGS. 6A and 6B are graphs showing relationship between a voltage applied to the electrostatic chuck and residual charge of a wafer. FIG. 7 is a graph showing relationship between a voltage applied to the electrostatic chuck and the number of generated particles.

First, a result of measuring the number of particles (having diameter of 80 nm or above) by actually performing the plasma processing method of the present invention will be described. FIG. 5 is a graph showing the result thereof. Here, Comparative Examples 1 and 2 are also carried out. Comparative Example 1 shows the case of performing the conventional method shown in FIG. 3B. Comparative Example 2 shows the case of not supplying a thermal conduction gas in the method of the present invention.

As shown in FIG. 5, in the conventional method in which the chuck voltage was fixed to 1100V, the number of particles was 200 or above, which is not preferable. In that case, the high frequency power for plasma generation was switched off after the application of the opposite voltage was stopped. Meanwhile, in the method of the present invention in which the chuck voltage was reduced from 1100V to 200V as shown in FIG. 3A, the number of particles was about 90, which was considerably reduced.

In Comparative Example 2 that is the same as the method of the present invention except that the thermal conduction gas is not supplied, the number of particles was reduced to about 100. In the actual plasma processing, if the thermal conduction gas is not supplied at all, the wafer temperature cannot be controlled and almost nothing is performed. As described above, in the method of the present invention, the number of particles can be considerably reduced, which is effective. The above result shows that the difference in the number of particles (about 10) between Comparative Example 2 and the method of the present invention is caused by the effect of the thermal conduction gas.

Next, the residual charge in the case of varying the application voltage (chuck voltage) to the electrostatic chuck 32 from 200V to 1100V was measured. The results are shown in FIG. 6A. As shown in FIG. 6A, the residual charge of the wafer was increased as the application voltage was increased from 200V to 1100V and decreased as time elapses.

Further, the residual charge was compared between the case of maintaining the application voltage to the electrostatic chuck 32 at 400V (conventional method) and the case of setting the application voltage to the electrostatic chuck 32 to 400V and then decreasing the application voltage to 200V for last 15 sec. The results are shown in FIG. 6B. As shown in FIG. 6B, in the method of the present invention, the residual charge was decreased to half compared to the conventional method in which the application voltage was fixed to 400V.

Then, the relationship between the application voltage to the electrostatic chuck 32 and the number of generated particles was measured. FIG. 7 is a graph showing the result thereof. The diameter of the measured particles has the diameter of 80 nm or above. Here, the application voltage to the electrostatic chuck 32 was varied from 200V to 1100V. As shown in FIG. 7, when the application voltage was 200V, the number of particles was almost zero. As the application voltage was increased, the number of particles was increased substantially in the form of a quadratic curve.

In other words, when the application voltage is set to a minimum level, e.g., 250V or less, the number of particles is a few, which is preferable. However, the decrease in the application voltage leads to the decrease in the chucking force. Thus, the pressure of the thermal conduction gas supplied to the bottom surface of the wafer needs to be decreased correspondingly. As described above, the minimum level of the application voltage (chuck voltage) which can ensure a sufficient chucking force is, e.g., about 150V.

In the test example, the application voltage (chuck voltage) to the electrostatic chuck 32 was decreased from the first voltage, e.g., 400V, to the second voltage, e.g., 200V, in a single step manner. However, it may be decreased in a multi step manner, i.e., in the form of stairs, or may be decreased continuously. When it is decreased continuously, it may be decreased in an oblique linear shape or in a curved shape such as a circular arc shape.

In the test example, the case in which the mounting table 26 is provided with the cooling jacket 30 serving as a cooling unit has been described as an example. However, the mounting table 26 may be provided with at least one of the cooling unit and a heating unit 100 (see FIG. 1). Further, the above-described plasma processing apparatus is only an example, and the present invention may be applied to an apparatus for performing plasma CVD processing, an apparatus for performing plasma etching, or the like.

Although a semiconductor wafer has been described as an example of the object to be processed, the semiconductor wafer includes a silicon substrate or a compound semiconductor substrate such as GaAs, SiC, GaN, or the like. The present invention may also be applied to a glass substrate used for a liquid crystal display, a ceramic substrate, or the like without being limited to the above substrates.

While the invention has been shown and described with respect to the embodiments, it will be understood by those skilled in the art that various changes and modification may be made without departing from the scope of the invention as defined in the following claims.

What is claimed is:

1. An object separating method for separating an object from an electrostatic chuck provided on a top surface of a mounting table, the method comprising:
   performing plasma processing being performed on the object in a state where the object is attracted and held on the electrostatic chuck by applying a first voltage as an application voltage to the electrostatic chuck and a thermal conduction gas is supplied to a gap between the electrostatic chuck and the object;
   decreasing the application voltage from the first voltage to a second voltage which is smaller than the first voltage and larger than zero and setting the application voltage to zero after said decreasing; and
   separating the object from the electrostatic chuck after said setting,
   wherein upon completion of said performing, the supply of the thermal conduction gas is stopped and the thermal conduction gas remaining between the electrostatic chuck and the object is exhausted during said decreasing and said setting, and
   wherein the top surface of the mounting table is in contact with the object during said decreasing and said setting.

2. The object separating method of claim 1, wherein the application voltage is decreased from the first voltage to the second voltage in a single-step manner.

3. The object separating method of claim 1, wherein the application voltage is decreased from the first voltage to the second voltage in a multi-step manner.

4. The object separating method of claim 1, wherein the application voltage is decreased from the first voltage to the second voltage gradually.

5. The object separating method of claim 1, wherein the second voltage is within a range from 150 V to 280 V.

6. The object separating method of claim 1, wherein the first voltage is within a range from 300 V to 1400 V.

7. The object separating method of claim 1, wherein a processing pressure in the plasma processing is within a range from 5 mTorr to 90 mTorr.

8. The object separating method of claim 1, wherein an opposite voltage is applied to the electrostatic chuck for a short period of time between said decreasing and said setting.

9. The object separating method of claim 1, wherein a plasma is generated in said decreasing, and a power for plasma generation is set to zero after said setting.

10. The object separating method of claim 1, wherein said decreasing includes maintaining the application voltage at the second voltage for a period of time.

* * * * *